(12) United States Patent
Cowan

(10) Patent No.: US 9,859,909 B1
(45) Date of Patent: Jan. 2, 2018

(54) ANALOG TO DIGITAL CONVERSION YIELDING EXPONENTIAL RESULTS

(71) Applicant: Linear Technology Corporation, Milpitas, CA (US)

(72) Inventor: Joshua Cowan, Durham, NC (US)

(73) Assignee: Linear Technology Corporation, Milpitas, CA (US)

(*) Notice: Subject to any disclaimer, the term of this patent is extended or adjusted under 35 U.S.C. 154(b) by 0 days.

(21) Appl. No.: 15/446,702

(22) Filed: Mar. 1, 2017

(51) Int. Cl.
*H03M 1/34* (2006.01)
*H03M 1/12* (2006.01)
*H05B 33/08* (2006.01)

(52) U.S. Cl.
CPC ...... *H03M 1/1235* (2013.01); *H05B 33/0845* (2013.01)

(58) Field of Classification Search
CPC .......................... H03M 1/1235; H05B 33/0845
USPC ........................................ 341/138, 155, 158
See application file for complete search history.

(56) References Cited

U.S. PATENT DOCUMENTS

| 4,625,197 A * | 11/1986 | Holmes ............... H03M 1/1235 341/120 |
| 2005/0177605 A1 | 8/2005 | Sudhakar |
| 2012/0176262 A1 | 7/2012 | Chen et al. |

FOREIGN PATENT DOCUMENTS

FR   2576166 A1   7/1986

OTHER PUBLICATIONS

Budzilek, Russ, "Linear vs. Logarithmic Dimming—A White Paper." [online] Pathway Lighting Products, Inc. [retrieved on Jan. 5, 2017]. Retrieved from the Internet: <URL: http://pathwaylighting.com/products/downloads/brochure/technical_materials_1466797044_Linear+vs+Logarithmic+Dimming+White+Paper.pdf>, 4 pages.

Hwang et al., "A Wide Dynamic Range Cmos Image Sensor Based on a New G-amma Connection Technique," SOC International, Design Conference IEEE, (ISOCC), 2012, International IEEE, Nov. 4, 2012 (Nov. 4, 2012), pp. 131-134.

Extended European Search Report dated Jul. 11, 2017 by the European Patent Office in Application 17000566.4.

* cited by examiner

*Primary Examiner* — Khai M Nguyen

(74) *Attorney, Agent, or Firm* — IntelleTek Law Group, PLLC

(57) ABSTRACT

A method and system of an analog to digital conversion having an exponential result are provided. An analog input signal is received by the ramp ADC. The analog input signal is converted into an N-bit digital signal having a linear relationship with the analog input signal. An internal gated clock signal is generated based on the received first clock signal. The gated clock signal is used as an input to an M-bit register. An output of the M-bit register is multiplied by a predetermined factor. The product of the multiplication is provided as an input to the M-bit register. The output of the M-bit register provides an M-bit output having an exponential relationship with the analog input signal.

20 Claims, 4 Drawing Sheets

ANALOG TO DIGITAL CONVERSION YIELDING EXPONENTIAL RESULTS

BACKGROUND

Technical Field

This disclosure generally relates to analog to digital converters, and more particularly, to analog to digital converters with an exponential output.

Description of Related Art

Typically, real world signals are in analog, which are translated to the digital domain by analog to digital converters (ADC's) in order to perform electronic processing, manipulation, computation, transmission, and storage. Accordingly, the analog to digital conversion process is usually an initial step within a larger measurement and control loop where digitized data is processed to control various components. In recent years, ADC's have been used to control the operation of light emitting diodes (LED's). For example, an analog input signal may be converted into the digital realm to create pulse width modulation (PWM) signals to control the intensity of LED's. Such LED drivers attempt to generate an accurate time domain signal from a less accurate analog (e.g., voltage or current) signal.

While an LED emits light that is directly proportional to the amount of current flowing through it, the human eye doesn't perceive brightness in the same way. Rather, a human perceives brightness on a logarithmic scale. With a linear profile, the changes in light level at the low end of the dimming range are large and may be perceived by a human as abrupt changes instead of a smooth transition in brightness. Thus, to properly control the brightness of the LED, the intensity of the LED should be varied logarithmically such that it is perceived as a continuous improvement in brightness, as an analog control input is varied linearly.

There are several known techniques to create a logarithmic-scale PWM signal from a linearly varying signal (e.g., voltage or current). In one example, an exponential collector current vs. base-emitter voltage characteristic of bipolar junction transistors (BJTs) is used to create a logarithmic effect. In this example, setting the charging and discharging current of a capacitor in a 555-style timer may cause the duty cycle of the PWM signal to change exponentially as the input signal is varied linearly. While these techniques may provide a high resolution due to the continuous (i.e., not discrete) nature of the components, they suffer in accuracy for several reasons. First, they rely on the absolute value of the current in a single BJT as well as the accuracy of the comparators used in the timer. Additionally, the period of the PWM signal varies with duty cycle since the charging and discharging currents vary.

Another example involves the use of a lookup table, which may take the form of a ROM or some compiled logic that provides a similar result. In such approach, a linear ADC produces an n-bit code, which is then used directly to address the lookup table. However, a lookup table may demand a significant amount of die area. Indeed, the physical size of a look up table scales exponentially with respect to the number of bits addressing it. Accordingly, such approach may quickly become cost prohibitive as the resolution improves.

The lookup table approach can also be implemented in software. However, such approach involves a microprocessor, which comes at a substantial size and power consumption penalty. Furthermore, this purely digital, code-based approach has the potential to lock up or become faulty. Additionally, since multiple instructions are waited to complete in order to provide the result, the microprocessor-software technique does not produce an exponential result as soon as the initial analog to digital conversion is available.

In yet another example of an analog approach, exponentially spaced PWM signals are created as a function of an input signal as it is compared to an internally generated ramp. In this example, the ramp is logarithmically shaped. The PWM "ON" periods correspond to when the input is above the internal signal, and the PWM "OFF" periods to when the input signal is below the internal signal. However, the accuracy of the PWM signal decreases as the duty cycle increases. The loss of accuracy is due to the comparator having a finite resolution. Further, as the logarithmic ramp flattens near the high end, noise begins to have a more pronounced impact, resulting in a larger deviation from the intended duty cycle.

BRIEF DESCRIPTION OF DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

DETAILED DESCRIPTION OF ILLUSTRATIVE EMBODIMENTS

Overview

In the following detailed description, numerous specific details are set forth by way of examples in order to provide a thorough understanding of the relevant teachings. However, it should be apparent that the present teachings may be practiced without such details. In other instances, well-known methods, procedures, components, and/or circuitry have been described at a relatively high-level, without detail, in order to avoid unnecessarily obscuring aspects of the present teachings. Some embodiments may be practiced with additional components or steps and/or without all of the components or steps that are described.

The methods and circuits disclosed herein generally relate to providing an analog to digital conversion having an exponential output. A predetermined number of PWM dimming codes are set by an external voltage, referred to herein as an analog input. An analog input signal is received by the ramp ADC. The analog input signal is converted into an N-bit digital signal having a linear relationship with the analog input signal. An internal gated clock signal is generated based on the received first clock signal. The gated clock signal is used as an input to an M-bit register. An output of the M-bit register is multiplied by a predetermined factor. The product of the multiplication is provided as an input to the M-bit register. The output of the M-bit register provides an M-bit output having an exponential relationship with the analog input signal.

The time domain accuracy is determined by a large number of clock cycles (per PWM cycle) leading to high accuracy and repeatability. By virtue of the methods and circuits described herein, it is possible to match two side-by-side light sources with independent PWM signals, when using the analog input signal, provided it has a reasonable resolution (e.g., as to fall within one code window). In one aspect, each step in the exponential result provides the same accuracy in the logarithmic output range. Accordingly, in contrast to ADC's that provide only a linear result, an exponential result is provided having the same accuracy in each increment, thereby providing an exponential result with a flat accuracy curve.

Example Architecture

Figure 1:
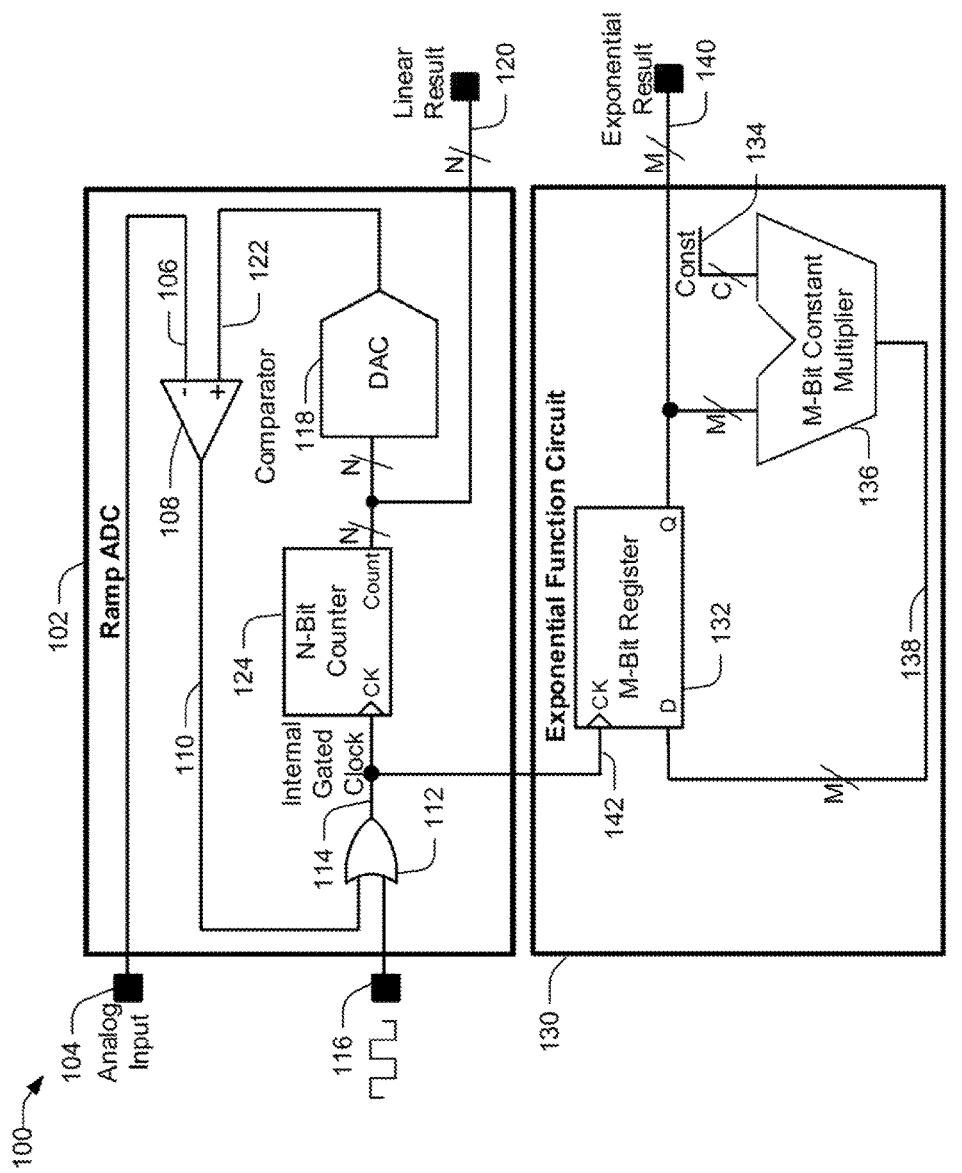
FIG. 1 illustrates a circuit block diagram of an analog to digital converter system providing an exponential result.

FIG. 1 illustrates a circuit block diagram of an analog to digital converter system 100 providing an exponential result. Circuit 100 includes a ramp type analog to digital converter circuit 102 coupled to an exponential function circuit 130. In various embodiments, any type of ramp ADC may be used, including current and voltage mode. Accordingly, the configuration of the ramp ADC 102 of system 100 is provided for discussion purposes by way of example only, not by way of limitation.

In the example of FIG. 1, the ramp ADC 102 includes an analog input node 104 operative to receive an analog signal, which is converted to an N-bit digital signal at its output 120, referred to herein as a linear result. Since a linear result is not necessary to generate an exponential result at node 140, in some embodiments, a linear result node 120 output is not provided. There is an N-bit counter 124 having a clock input and an N-bit output. There is a digital to analog converter (DAC) 118 coupled to the output of the N-bit counter 124.

There is a comparator 108 having a first input 106 configured to receive the analog signal from the input node 104, and a second input 122 coupled to an output of the DAC 118. There is a logic gate 112 having a first input coupled to the output 110 of the comparator 108 and a second input operative to receive a clock signal 116, which may be a system clock or any other appropriate reference clock. The output 114 of the logic gate 112 is configured to provide an internal gated clock, which is coupled to the input of the N-bit counter 124. In various embodiments, the gate 112 may be an OR, AND, NOR, or a NAND gate with the appropriate inversion of the input/output nodes, such that an internal gated clock signal at the output of the gate 114 stops when the comparator identifies a trigger event (e.g., the output 122 of the DAC is above the analog input signal provided at the analog input 104, which is identified by the comparator 108).

In one embodiment, the comparator 108 includes hysteresis to prevent its output 110 to fluctuate near a trigger event. Different types of hysteresis comparators may be used in the conversion. Hysteresis prevents the internal gated clock from providing erroneous clock pulses to the exponential function circuit 130. In one embodiment, in addition to this hysteresis (i.e., in the comparator 108) there is a second form of hysteresis, configured to prevent random transitions between neighboring exponential result codes as a result of noise in the analog control signal.

The general concept is to connect the output of an N-bit binary counter 124 to the input of a DAC 118, then compare, using the comparator 108, the analog output of the DAC 118 with the analog input signal 104 to be digitized and use the comparator's output 110 to tell the counter when to stop counting and reset. In this regard, it is noted that in some embodiments, the counter 124 is not free running in that it is gated by a logic gate 114. The logic gate 112 provides an internal gated clock at its output 114, which prevents the reference clock signal at node 116 to propagate to the N-bit counter 124 when the analog input is at or below the output 122 of the DAC 118.

As the N-bit counter 124 counts up with each internal gated clock pulse, the DAC 118 outputs a slightly higher (more positive) voltage (or current). This voltage (or current) at node 122 is compared against the input voltage (or current) at node 106 by the comparator 108. If the input voltage (or current) 106 is greater than the DAC 118 output 122, the comparator's output 110 will be low and the counter will continue counting normally. However, eventually, the DAC output 122 may exceed the input voltage (or current) 106, causing the comparator's output 110 to go high. This transition causes the internal gated clock to prevent from switching further (e.g., will remain high or low). Accordingly, in one embodiment, an N-bit digital linear result may be provided at an output 120 of the ramp ADC 102 that is a digital representation of the signal received at the analog input 104.

The exponential function circuit 130 includes an M-bit digital register 132 (sometimes referred to as an accumulator) having a first input 142 (i.e., a clock input) configured to receive the internal gated clock signal of the ramp ADC 102. There is an M-bit constant multiplier 136 comprising a first input coupled to the output of the M-bit digital register 132, a second input 134 operative to receive a C-bit constant reference signal (which, in various embodiments, may be a voltage or a current), and an output 138 coupled to the second input of the M-bit register 132.

In one embodiment, the M-bit register 132 is comprises parallel flip-flops (e.g., D type), sharing the same internal gated clock 142 signal, wherein the output of each flip-flop represents one bit of the M-bit code 140. During each cycle of the internal gated clock 142, the constant multiplier 136 adds together several "bit-shifted" copies of the M-bit code 140 yielding the M-bit result 138. The M-bit result 138 is latched into the parallel flip-flops simultaneously.

In one embodiment the M-bit constant multiplier 236 is a pipelined multiplier for better throughput. Such pipelined multiplier may be used, for example, when the clock signal at the input 242 is sufficiently fast such that a single-cycle multiplier would have unacceptable propagation delay (i.e., could not settle fast enough to provide the correct result within one clock cycle). The number of bits comprising the signal 140, M, along with fabrication process parameters, will determine whether or not a pipelined or single-cycle multiplier may be used. In some embodiments, the ramp-type ADC may require the clock to be slow enough to obviate the need for a pipelined multiplier. It should be noted that there may be an area penalty by using a pipelined multiplier, but the critical path delay between the clock input 242 and the data input 232 of the M-bit register 232 would be reduced.

At the beginning of the conversion of the analog input signal 104 to the exponential result 140, when the N-bit counter 124 is reset to 0 (e.g., at the beginning of each conversion cycle), the M-bit register 132 is seeded with a constant value, $k_0$. Each time the internal gated clock increments the N-bit counter 124, the M-bit value in the M-bit register 132 is multiplied by a constant factor (i.e., C) and the result stored in the M-bit register 132. Expressed mathematically, $k_{n+1}=C \times k_n$. As soon as the output 122 of the DAC 118 of the ramp ADC 102 exceeds the analog input signal at the analog input node 104, the conversion is complete and an M bit exponential result is provided at the output 140. Notably, similar to the linear digital result provided at the linear output 120, the exponential digital result is available immediately, without having to wait for another system clock cycle. For some embodiments, the exponential result will be used to determine the duty cycle of a PWM signal. Further, in one embodiment, since the exponential result 240 grows faster than the linear result 210, the M-bit code, which will define the PWM duty cycle, may be available in less time than the resultant ON duration of the present PWM period. Stated differently, in one embodiment, there is zero PWM cycle latency from conversion to use as a PWM duty cycle determiner, without glitches (i.e., erroneous ON and OFF transitions at a frequency higher than that of the PWM signal).

Compared to the hardware and software lookup table approach, the methods and circuits described herein use less area. For example, the ramp-type ADC scales linearly in area with the number of bits in the N-bit counter 124 (see FIG. 1), unlike other topologies, like flash and successive-approximation-register (SAR). Further, the M-bit constant multiplier 136 used to create the exponentially spaced codes simply multiplies by a predetermined constant and can therefore also scale linearly with the number of bits as in the M-bit register 132.

Figure 2:
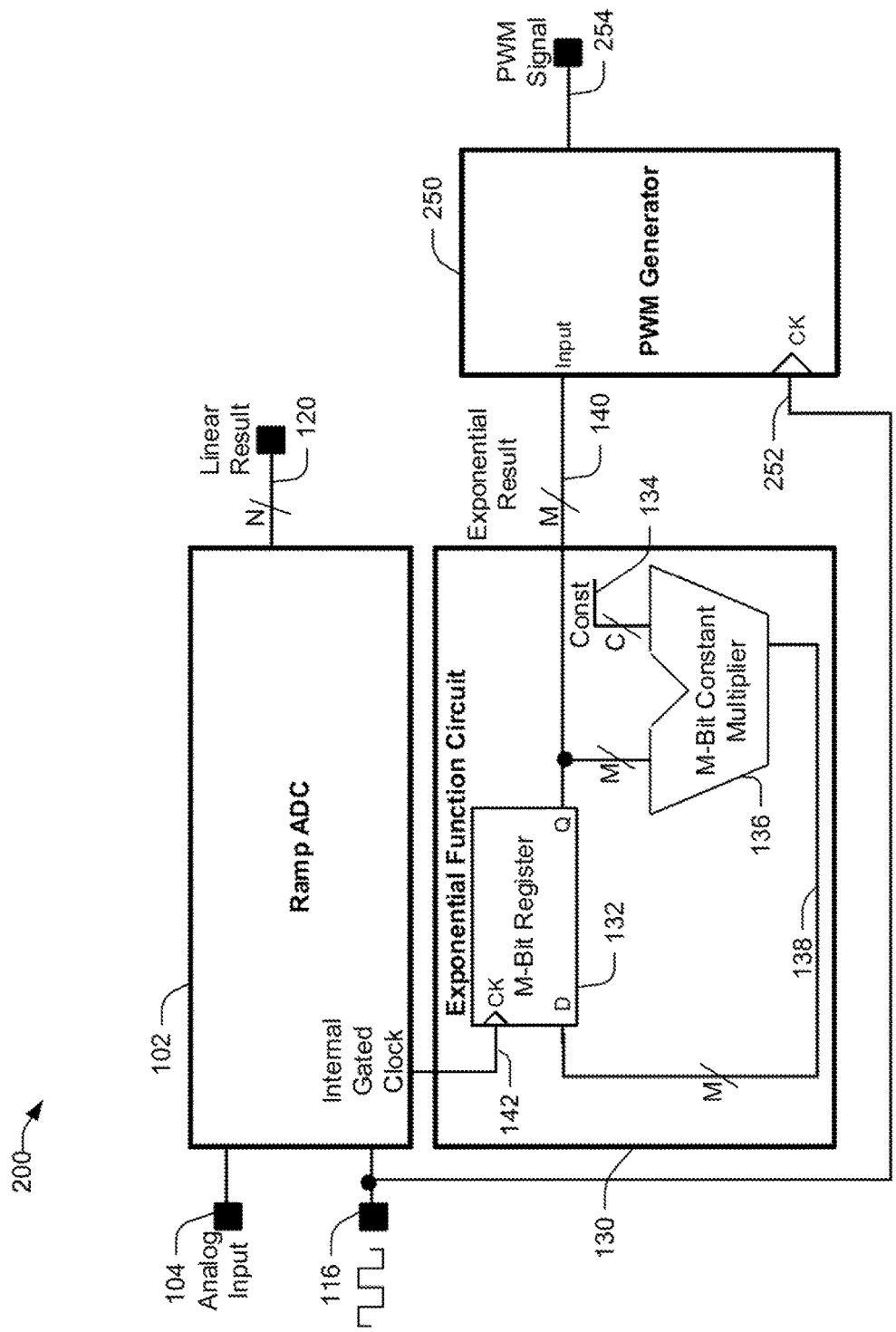
FIG. 2 illustrates a conceptual block diagram of an analog to digital converter system providing a pulse width modulation (PWM) output.

FIG. 2 illustrates a conceptual block diagram of an analog to digital converter system 200 providing a pulse width modulation (PWM) output. System 200 provides a PWM signal output 254 having exponential increments with respect to an analog input 204. Circuit 200 includes a ramp type ADC circuit 202 coupled to an exponential function circuit 230. In one embodiment, the ramp ADC and the exponential function circuit 230 may be similar to those of FIG. 1 and therefore not discussed in detail for brevity.

There is a PWM generator block 250 having a first input 240 that is coupled to the M-bit output 240 of the exponential result of the exponential function circuit 230. The second input 252 (i.e., a clock input) is configured to receive an input clock signal, which, in one embodiment, is a system clock (i.e., and not the internal gated clock signal provided by the ramp ADC 202). Thus, while the exponential function circuit 230 operates on the internal gated clock, the PWM generator 250 operates on the same clock input as the ramp ADC 202, not the internal gates clock 242. The PWM generator 250 is configured to receive the M-bit exponential result at the output 240 of the exponential function circuit 230 and create a PWM signal therefrom. Put differently, the exponential result is encoded in a series of pulses, wherein the pulse width is modulated to represent the M-bit exponential result. In various embodiments, different types of circuits may be used to implement a PWM generator. An implementation is provided by way of example, and not limitation, below.

Figure 3:
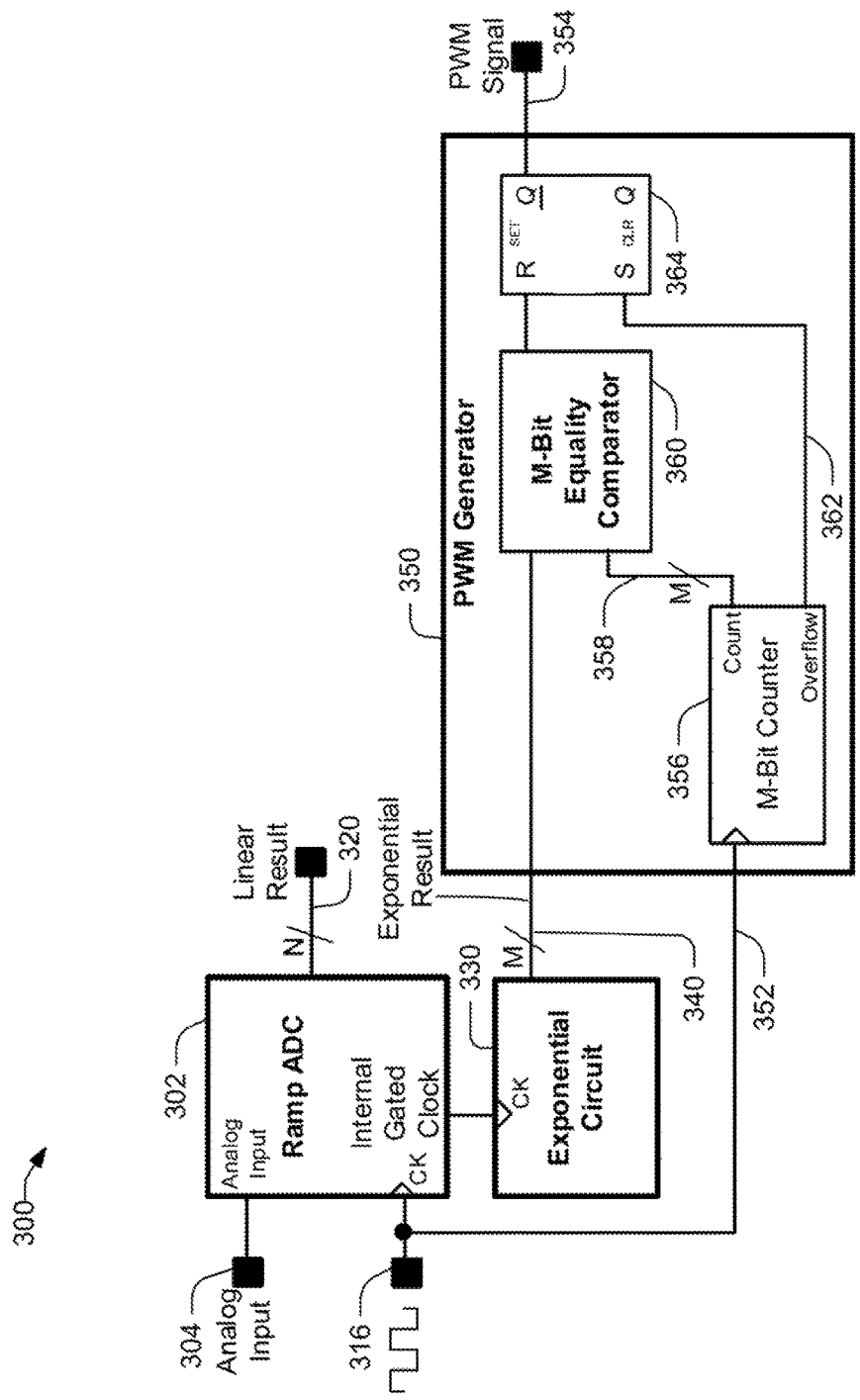
FIG. 3 illustrates a conceptual block diagram of an analog to digital converter system with a more detailed view of a pulse width modulation (PWM) generator of FIG. 2, consistent with an exemplary embodiment.

FIG. 3 illustrates a conceptual block diagram of an analog to digital converter system 300 with a more detailed view of a PWM generator 350, consistent with an exemplary embodiment. Circuit 300 includes a ramp type ADC circuit 302 coupled to an exponential function circuit 330. In one embodiment, the ramp ADC 302 and the exponential function circuit 330 may be similar to those of FIG. 2 and are therefore not discussed in detail here for brevity.

The PWM generator 350 has a free flowing M-bit counter 356 that is configured to receive a clock signal at its input 352. In one embodiment, the clock signal is from the same source 316 as used by the ramp ADC 302. There is an M-bit equality comparator 360 having a first input configured to receive the M-bit exponential result of the exponential circuit 330 and a second input coupled to an output 358 of the M-bit counter 356, and operative to compare these two input signals to identify a match. There is a flip-flop (illustrated in FIG. 3 by way of example and not by way of limitation as an RS flip-flop) configured to receive the output of the M-bit equality comparator 360 at its first input (i.e., R) and an overflow signal 362 from the M-bit counter 356 at its second input (i.e., S).

In one embodiment, when both inputs to the flip-flop 364 are low, there is no change (i.e., the previous state is maintained). When the R input is high and the S input is low, then the PWM output signal 354 is reset. If the S input is high and the R input is low, the output is set high. In one embodiment having both R and S inputs at a high are forbidden. In such a manner, the PWM signal 354 goes high when the counter 356 overflows and sets the RS flip-flop 364, beginning the PWM period. The PWM signal 354 remains high until the counter output 358 reaches the value of the PWM code 340. The equality comparator 360 then sends a pulse to the RS flip-flop 364 to reset it, driving the PWM signal 354 low. The PWM signal 354 remains low until counter 356 overflows (i.e., $2^M$–(the vale at 340) cycles). When the counter 356 overflows, the process repeats.

In one embodiment, the number of bits in the PWM duty cycle code at node 354 are different from the number of bits in the ramp type ADC 302. Such approach may be used, for example, to provide high time domain resolution of the PWM signal 354, which is limited by the number of bits in the exponential result 340 without imposing high accuracy requirements on the analog input signal 304, which is limited by the N-bit code 320. Additionally, since the period of the PWM signal 354 at the output of the PWM generator 350 is determined by the number of clock 316 cycles used to count through all of the bits in the PWM duty cycle code provided as an exponential result 340 by the exponential function circuit 330 (i.e., as long as the N-bit counter 124 has fewer bits than the M-bit register (i.e., N<M)) then it becomes possible, using an input and output multiplexer, for more than one conversion to take place within a single PWM period. By virtue of the N-bit counter 124 having fewer bits than the M-bit register, multiple channels may share a single PWM code generator 350 if an input multiplexer is used. By way of non-limiting example, the N-bit counter 124 may have 7 bits and the M-bit register may have 12 bits (i.e., N=7, M=12), thereby theoretically allowing up to 32 channels to share a same PWM code generator 350. For example, expressed mathematically, $(2^{12})/(2^7)=2^{(12-7)}=32$ possible conversion cycles per PWM cycle. Furthermore, the methods and circuits discussed herein do not interfere with the re-use of the input (control) signal pin as an input pin for a separate, parallel digital system. This allows simple ON/OFF functionality to exist alongside analog control of the PWM duty cycle. As a result, advanced exponential fades and other high dynamic range functions may be implemented by simply shaping the input signal (e.g., a voltage) at the analog input 304, without the need of software intervention and without the loss of simple ON/OFF functionality that could be controlled by software, hardware, or combination thereof.

In one embodiment, the DAC of the ramp ADC 302 imposes tighter timing requirements (i.e., longer) for settling time than the multiplier of the exponential circuit 330. Whether the DAC or multiplier dominates critical path delay depends on the number of bits N and M. In one example, the counter of the ramp ADC 302 runs at a fraction of the M-bit counter 356 of the PWM generator, wherein the fraction may be a tunable parameter. Running the ramp ADC clock at a fraction of the PWM generator clock allows more settling time for the DAC and may reduce the die area and power requirements for the same accuracy of the input signal 204 comparison.

Seed Value and Scaling Factor

Referring back to FIG. 2, the seed value of the M-bit register 232, $K_0$, and the scaling factor, C (which is the constant 234), are chosen to avoid overflow and loss of dynamic range of the M-bit code 240. To provide a small form factor (i.e., to save die area), in one embodiment, the architecture of the constant multiplier 236 of FIG. 2 may use fixed point arithmetic circuits, due to the smaller size footprint provided by such circuits. Of course, in other embodiments, other approaches, such floating point circuits, which come with the penalty of a larger footprint, can be used instead to reduce the impact of arithmetic errors. The seed value and the scaling factor vary based on the type of arithmetic used. The following discussion provides example calculations for the seed value and scale factor, respectively, assuming fixed-point arithmetic circuits.

The relevant parameters include the number of bits received by the PWM generator 250 (i.e., M), and the number of bits of the counter of the ramp ADC 202 (i.e., N), representing the number of bits of voltage range. For example, if N=7 and M=12, $2^{12}$=4096 possible PWM duty ratio values are provided, of which $2^7$=128 are available to a user via the analog input 204. In one embodiment, the preferred scaling factor and seed value pair will include the following properties: (i) a large M-bit code dynamic range; (ii) lack of M-bit code overflow; and (iii) gentle transition into ADC overflow. For a large M-bit code dynamic range (i.e., "first property"), the objective is to find the seed value yielding the highest mathematically possible result of the quotient ($2^M$)/(seed value), which will vary with M. To prevent the M-bit code overflow (i.e., "second property"), all $2^N$ values of the linear result 220 should be reachable without overflow of the M-bit code at the exponential result 240. To provide a gentle transition into the ramp ADC 202 overflow as the analog signal 204 exceeds the range of the converter (i.e., "third property"), the last value of the M-bit code at node 240 should be one scaling factor below $2^M$, or within the acceptable accuracy of the value $2^M$. If the 2^Nth value of the M-bit code is any fraction of the scaling factor other than 0 or 1 away from $2^M$, the final transition as the analog control signal 204 leaves the valid input range will appear abrupt and discontinuous.

In one embodiment, selecting the seed value and scale factor pair involves iteration. For example, the scale factor at node 234 may be expressed as a set of shift operations called "taps." A shift tap is the result of a right shift operation by a predetermined number of bits. At least one and fewer than M shift taps (i.e., M−1) exist. The results of all of the shift taps will be added together into an intermediate result to form the multiplication operation. That result is added to the value in the M-bit register 232. By way of illustrative example, the shift and add operation described herein appears in FIG. 2 as the C-bit constant multiplier at node 234.

The overflow requirement, expressed in the second property above, is satisfied first by the selection of the seed value $k_0$. The seed value is bounded by fixed-point truncation error and the second property (i.e., prevention M-bit code overflow). For example, an initial seed value of 2 may be selected (i.e., a 1 in the 2's place and 0's elsewhere). Next, a single shift tap of 1 is applied (i.e., the number is shifted right by 1 and added to the present result). By way of a numeric example, and not by way of limitation, for cycle one this is adding 1 to the value 2 yielding 3; for the second cycle this is adding 1 to the value 3, yielding 4. This operation is repeated $2^N$ times or until the M-bit code overflows. Upon overflow of the M-bit code, this seed value is discarded, as it does not satisfy the second property.

Next, the process is repeated with a 1 in the 4's place and 0's elsewhere with a shift tap at 2 (i.e., shift right by 2). This step is repeated for each power of 2 in the M-bit code, advancing the shift tap to be one bit below the 1 for each case. Only a few of these seed values may satisfy the second property by not overflowing the M-bit code during the first $2^N$ operations.

From the resultant seed values, in one embodiment, the smallest of the tested values (i.e., a positive integer) that satisfies the second property is selected. There is no need to add any extra 1's below the 1 in the chosen seed value, since any such bits being set to 1 will have no effect on the multiplication operation due to fixed point arithmetic truncation. In one embodiment, the smallest seed that satisfies the second property is selected in order to satisfy the first property (i.e., a large M-bit code dynamic range). The maximum value of the M-bit code is fixed at $2^M$. Accordingly, minimizing the seed value results in the highest dynamic range.

In one embodiment, in order to satisfy the third property (i.e., a gentle transition into ADC overflow), additional shift taps may be applied. For example, if the $2^{Nth}$ value of the M-bit code is much lower than $2^M$ (e.g., by a factor of 2 or more), one or more shift taps are added within a predetermined number of bits of the first one. In one embodiment, the predetermined number is 3. If the $2^{Nth}$ value is within a predetermined threshold of $2^M$, but does not satisfy the third property, shift taps are added within a predetermined number of bits of the $M^{th}$ bit. In one embodiment, the predetermined factor is the scale factor and the predetermined number is 3. Adding shift taps below the initial one violates the second property.

By way of a numeric example, and not by way of limitation, if the seed value is 32, the lowest shift tap should be 5, such that the 1 in the 32's place becomes a 1 in the 1's place at the first cycle. If a shift tap of 4 were used, the series would grow faster and overflow, since using the lower seed value of 16 with a shift tap of 4 would have already been ruled out as violating the second property in a previous step if a seed value of 32 had been chosen.

Each additional shift tap changes the $2^{Nth}$ value. Consequently, finding the appropriate scale factor (set of taps) may involve iteration. All $2^N$ available values of the M-bit word should be checked each time a new shift tap is added to ensure that the second property is not violated. To that end, a fixed-point arithmetic operation is used with appropriate truncation. In one embodiment, a discrete event simulator and/or a hardware description language such as Verilog may be used in the selection process of the seed value and the scale factor.

In some embodiments, the scale factor C may vary as a function of the duty cycle code at the PWM output 254. Accordingly, the input 234 of the M-bit constant multiplier may be coupled to a circuit that provides a factor that varies as a function of the duty cycle. Such technique allows the curve of the signal 240 to be shaped beyond an exponential curve in order to achieve a desired effect. Such approach can alleviate fixed-point arithmetic errors that may affect the lower duty cycle codes. An example of varying the scale factor to alleviate fixed-point arithmetic error includes having the scale factor be slightly larger at lower PWM duty cycle values, to more closely approximate rounding, instead of accepting the less accurate down-only truncation of uncorrected fixed-point arithmetic.

Example Use Case

The methods and systems described herein can be used in various applications. An example use case of driving an LED is provided below. By virtue of the methods and devices described herein, when the ADC is coupled to an LED driver, at the low end of light intensity, the digital values (e.g., codes) that define a PWM dimming duty cycle are closer together relative to the maximum available intensity than the dimming codes nearer the high end of the light intensity. For example, a linear (e.g., voltage) signal (e.g., 320 in FIG. 3) with limited resolution (e.g., 128:1) can be mapped into a finite set of high accuracy time domain signals (e.g., 4096:1 absolute accuracy), with the duty cycle of the PWM signals 354 increasing non-linearly from an initial low dimming value (e.g., near 200:1) to ultimately reaching 100% dimming (i.e., full intensity). The duty cycle spacing between adjacent codes is a fixed percentage of the duty cycle, such that relative accuracy is constant over the entire dimming range.

Any type of ramp-type ADC can be used to produce an exponentially spaced result for PWM dimming of an LED (and many other applications). In various embodiments, the exponential result may be provided as a raw M-bit output signal or as a PWM output signal (i.e., when the exponential circuit discussed herein is coupled to a PWM generator). In some embodiments, a linear result is provided concurrently with an exponential result.

The methods and systems described herein provide a dynamic range of the exponential result that is greater than the input signal. By way of contrast, if instead the linear result were used as the PWM code, the relative accuracy of the PWM dimming would decrease as the dimming codes grew small. For example, if the codes were spaced at 1% increments, moving from 99% to 100% would have 1% accuracy, but moving from 9% to 10% would have a relative accuracy of only 10%, and moving from 1% to 2% would have a very poor relative accuracy of 100%. To increase the low-end accuracy involves more codes, which implies greater accuracy constraints for the analog portion of the ADC. If instead each PWM dimming code is separated from its neighbors by a fixed percentage, the relative accuracy is constant across the entire range of dimming codes. For example, moving from 0.96% to 1% has the same relative accuracy as moving from 9.6% to 10% and also from 96% to 100%.

In one embodiment, the accuracy of the PWM dimming signal can also exceed that of the analog portion of the ADC, relaxing design constraints and also allowing users to relax the accuracy constraints of their control signals. Since the linear and exponential results can exist digitally, loss of precision in the higher dynamic range exponential result is not a concern.

Example Graph

Figure 4:
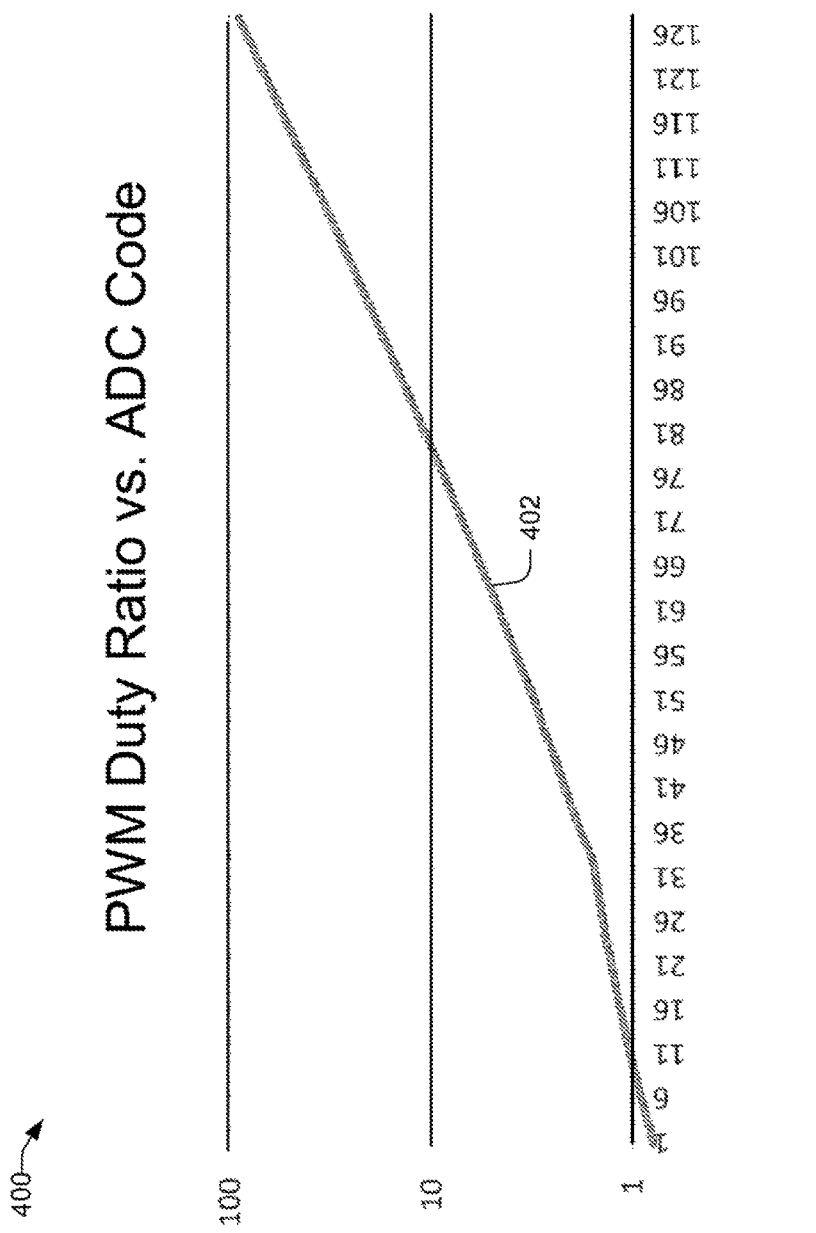
FIG. 4 illustrates a graph of a pulse width modulation (PWM) duty ratio vs. an analog to digital conversion (ADC) code, consistent with an exemplary embodiment.

With the foregoing discussion of the architecture and functionality of an ADC that provides an exponential output, it may be helpful to provide a graphical explanation. To that end, FIG. 4 illustrates a graph 400 of a PWM duty ratio vs. an ADC code, consistent with an exemplary embodiment. For the example of FIG. 4, the ramp ADC uses a 7-bit counter while the register of the exponential function circuit has 12 bits. Each individual 7-bit code maps to one unique 12-bit code, but the 12-bit codes are separated exponentially from one another, whereas the 7-bit codes are separately linearly from one another.

Each code increases in a discrete step, respectively. As mentioned previously, the 12-bit code does not reach 4096 before the 7-bit code reaches 127 to prevent the waste of potential input values by repetition. The combination of these constraints leads to the curve 402.

CONCLUSION

The components, steps, features, objects, benefits, and advantages that have been discussed are merely illustrative. None of them, nor the discussions relating to them, are intended to limit the scope of protection in any way. Numerous other embodiments are also contemplated. These include embodiments that have fewer, additional, and/or different components, steps, features, objects, benefits, and/or advantages. These also include embodiments in which the components and/or steps are arranged and/or ordered differently.

Unless otherwise stated, all measurements, values, ratings, positions, magnitudes, sizes, and other specifications that are set forth in this specification, are approximate, not exact. They are intended to have a reasonable range that is consistent with the functions to which they relate and with what is customary in the art to which they pertain.

Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as "first" and "second" and the like may be used solely to distinguish one entity or action from another, without necessarily requiring or implying any actual relationship or order between them. The terms "comprises," "comprising," and any other variation thereof when used in connection with a list of elements in the specification or claims are intended to indicate that the list is not exclusive and that other elements may be included. Similarly, an element preceded by an "a" or an "an" does not, without further constraints, preclude the existence of additional elements of the identical type.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. An analog to digital converter (ADC) providing an exponential result, comprising:
 a ramp ADC comprising:
  a first input configured to receive an analog input signal;
  a second input configured to receive a first clock signal; and
  a logic gate having an output operative to provide an internal gated clock signal based on the received first clock signal; and
 an exponential function circuit comprising:
  an M-bit digital register comprising:
   a first input configured to receive the internal gated clock signal of the ramp ADC;
   a second input; and
   an output operative to provide an M-bit exponential digital result of the analog input signal; and
  an M-bit multiplier circuit comprising:
   a first input coupled to the output of the M-bit digital register;
   a second input operative to receive a reference signal; and
   an output coupled to the second input of the M-bit digital register.

2. The ADC of claim 1, wherein the ramp ADC further comprises:
 an N-bit counter having a clock input operative to receive the internal gated clock signal and an output operative to provide an N-bit output;
 a digital to analog converter (DAC) configured to receive the N-bit output of the counter; and
 a comparator having a first input coupled to the first input of the ramp ADC and a second input coupled to an output of the DAC,
 wherein the logic gate comprises:
  a first input configured to receive the first clock signal;
  a second input coupled to an output of the comparator; and
  an output operative to provide the internal gated clock signal.

3. The ADC of claim 2, wherein the logic gate is configured to propagate the first clock signal only when a level of the analog input signal is higher than a level of a signal at the output of the DAC.

4. The ADC of claim 2, wherein the comparator includes hysteresis.

5. The ADC of claim 2, wherein a number of bits N is lower than a number of bits M.

6. The ADC of claim 2, wherein:
 the N-bit output of the N-bit counter is provided as a first output of the ADC; and
 the M-bit output of the digital register is provided as a second output of the ADC.

7. The ADC of claim 1, further comprising an M-bit PWM generator having a first input coupled to the output of the M-bit register and an output operative to provide a PWM signal based on the exponential digital result.

8. The ADC of claim 7, wherein the M-bit PWM generator comprises:
 an M-bit counter comprising:
  an input configured to receive the first clock signal and a first output operative to provide an M-bit count;
  a first output operative to provide an M-bit count signal; and
  a second output operative to provide an indication of an overflow;
 an M-bit equality comparator comprising:
  a first input coupled to the output of the M-bit register of the exponential function circuit;
  a second input coupled to the first output of the M-bit counter; and
  an output; and
 an RS flip-flop comprising:
  a reset input coupled to the output of the M-bit equality comparator;
  a set input coupled to the second output of the M-bit counter; and
  an output operative to provide the PWM signal.

9. The ADC of claim 7, further comprising a circuit configured to provide a reference signal that varies as a function of the duty cycle of the PWM signal.

10. The ADC of claim 1, wherein the M-bit multiplier is a pipelined multiplier.

11. The ADC of claim 1, wherein the reference signal is a constant that is provided to the M-bit multiplier as a set of between 1 and (M−1) right shift operations, each right shift being of a predetermined number of bits that are between 1 and M to be summed to form a multiplication operation.

12. The ADC of claim 1, wherein the M-bit multiplier circuit uses a seed value and a scale factor to provide all $2^N$ values of the N-bit output of the N-bit counter without an overflow of the M bit exponential result at the output of the M-bit digital register.

13. The ADC of claim 1, wherein each step in the M-bit exponential digital result of the analog input signal has a substantially similar relative accuracy.

14. A dimming PWM generator of an LED driver comprising the ADC of claim 1.

15. A method of providing an analog to digital conversion using a ramp analog to digital converter (ADC), the method comprising:
 receiving an analog input signal by the ramp ADC;
 receiving a first clock signal;
 converting the analog input signal into an N-bit digital signal having a linear relationship with the analog input signal;
 generating an internal gated clock signal based on the received first clock signal;
 using the gated clock signal as an input to an M-bit register;
 multiplying an output of the M-bit register by a predetermined factor; and
 providing a product of the multiplication as an input to the M-bit register, wherein the output of the M-bit register provides an M-bit output having an exponential relationship with the analog input signal.

16. The method of claim 15, further comprising:
 comparing the analog input signal to a signal at an output of a digital to analog converter (DAC) of the ramp ADC; and
 propagating the first clock signal as the gated clock signal only when a level of the analog input signal is higher than a level of the signal at the output of the DAC, based on the comparison.

17. The method of claim 16, further comprising including hysteresis in the conversion.

18. The method of claim 16, wherein a number of bits N is lower than a number of bits M.

19. The method of claim 15, further comprising providing a PWM output signal that represents the exponential relationship.

20. The method of claim 15, wherein each step in the M-bit output having an exponential relationship with the analog input signal, has a substantially similar relative accuracy.

\* \* \* \* \*